(12) United States Patent
Frosien et al.

(10) Patent No.: US 8,785,849 B2
(45) Date of Patent: Jul. 22, 2014

(54) ULTRA HIGH PRECISION MEASUREMENT TOOL

(75) Inventors: Juergen Frosien, Riemerling (DE); Dieter Winkler, Munich (DE); Udo Weigel, Munich (DE); Stefan Grimm, Kirchheim (DE)

(73) Assignee: ICT Integrated Circuit Testing Gesellschaft für Halbleiterprüftechnick mbH, Heimstetten (DE)

( * ) Notice: Subject to any disclaimer, the term of this patent is extended or adjusted under 35 U.S.C. 154(b) by 1539 days.

(21) Appl. No.: 12/133,298

(22) Filed: Jun. 4, 2008

(65) Prior Publication Data

US 2009/0289185 A1 Nov. 26, 2009

(30) Foreign Application Priority Data

May 21, 2008 (EP) .................................... 08156665

(51) Int. Cl.
*G21K 5/04* (2006.01)

(52) U.S. Cl.
USPC ............................ 250/309; 250/306; 250/307

(58) Field of Classification Search
USPC ............ 250/306, 307, 309, 310, 311; 850/29, 850/40, 41, 45, 48, 49, 53, 56, 57, 58, 59, 850/60, 61
See application file for complete search history.

(56) References Cited

U.S. PATENT DOCUMENTS

| 6,452,174 | B1* | 9/2002 | Hirose et al. | 850/43 |
| 6,727,501 | B1* | 4/2004 | Fan et al. | 250/307 |
| 7,570,057 | B2* | 8/2009 | Tsuchiya et al. | 324/318 |
| 2005/0092922 | A1 | 5/2005 | Muto et al. | |
| 2005/0128344 | A1* | 6/2005 | Suhara et al. | 348/370 |
| 2005/0184028 | A1* | 8/2005 | Baur et al. | 216/92 |
| 2007/0138388 | A1* | 6/2007 | Ward et al. | 250/288 |
| 2008/0100313 | A1* | 5/2008 | Shinohara et al. | 324/754 |

FOREIGN PATENT DOCUMENTS

JP 61-135035 6/1986

OTHER PUBLICATIONS

Hong-Shi Kuo, Ing-Shouh Hwang, Tsu-Yi Fu, Yu-Chun Lin, Che-Cheng Chang, and Tien T. Tsong, Noble Metal/W(111) Single-Atom Tips and Their Field Electron and Ion Emission Characteristics, Japanese Journal of Applied Physics, vol. 45, No. 11, 2006, pp. 8972-8983, XP007903666.

Tsu-Yi Fu, Lung-Chieh Cheng, C. H. Nien, and Tien T. Tsong, Method of Creating a Pd-Covered Single-Atom Sharp W Pyramidal Tip: Mechanism and Energetics of Its Formation, Physical Review B, vol. 65, 113401, XP-002439177.

(Continued)

*Primary Examiner* — Nicole Ippolito
(74) *Attorney, Agent, or Firm* — Patterson & Sheridan, L.L.P.

(57) ABSTRACT

A focused ion beam device is described comprising a gas field ion source with an analyzer for analyzing and classifying the structure of a specimen, a controller for controlling and/or modifying the structure of the specimen according to the analysis of the analyzer, an emitter tip, the emitter tip has a base tip comprising a first material and a supertip comprising a material different from the first material, wherein the supertip is a single atom tip and the base tip is a single crystal base tip. Furthermore, the focused ion beam device has a probe current control and a sample charge control. A method of operating a focused ion beam device is provided comprising applying a voltage between a single emission center of the supertip and an electrode, supplying gas to the emitter tip, analyzing and classifying the structure of a specimen, and controlling the structure of the specimen.

23 Claims, 9 Drawing Sheets

(56) References Cited

OTHER PUBLICATIONS

Hong-Shi Kuo, Ing-Shouh Hwang, Tsu-Yi Fu, Jun-Yi Wu, Che-Cheng Chang, and Tien T. Tsong, Preparation and Characterization of Single-Atom Tips, NANO Letters, 2004, vol. 4, No. 12, pp. 2379-2382, XP-002439176.

EP Search Report, Application No. 08156665.5-2208, dated Oct. 17, 2008.

* cited by examiner

ULTRA HIGH PRECISION MEASUREMENT TOOL

FIELD OF THE INVENTION

The present invention relates to a charged particle beam device and a method of operating a charged particle beam device. Particularly, it relates to a focused ion beam device having a gas field ion source with an emitter, in particular for imaging, inspecting, and/or structuring a specimen. Further, it relates to a method of operating a focused ion beam device for emitting during operation of a focused ion beam including ions of a gas. Specifically, it relates to an emitter supertip.

BACKGROUND OF THE INVENTION

Technologies such as microelectronics, micromechanics and biotechnology have created a high demand for structuring and probing specimens within the nanometer scale. Micrometer and nanometer scale process control, inspection or structuring, is often done with charged particle beams. Probing or structuring is often performed with charged particle beams which are generated and focused in charged particle beam devices. Examples of charged particle beam devices are electron microscopes, electron beam pattern generators, ion microscopes as well as ion beam pattern generators. Charged particle beams, in particular ion beams, offer superior spatial resolution compared to photon beams, due to their short wavelengths at comparable particle energy.

Miniaturization is a desirable aim in semiconductor industry but also in other areas containing micrometer and nanometer components like magnetic heads and optical storage devices. These miniaturized components require process control equipment with increasing accuracy and precision. The process control includes critical dimension (CD) measurement as well as defect inspection review (DR). By using these control options, controlling of the quality and the defects of the specimen becomes possible. State of the art tools for such purposes are scanning electron microscopes (SEM) based electron beam tools.

The performance of SEM tools having beam energies of typically 100 eV to 5 keV is principally limited by the achievable spot size. The diameter of the spot is in the range of a few nanometers. This size is the result of a compromise between diffraction and chromatic aberration of the electron optical column involved.

Focused ion beam devices have been suggested, e.g., for CD and DR applications. In particular gas field ion sources (GFIS) have been proposed providing high current sub-nanometer probe sizes.

To generate a particle beam, a voltage is supplied to an emitter in the presence of an operation gas. Therefore, particles like ions of the operation gas are emitted from an emitter tip. Accordingly, as the demand for measurement tools with high resolution increases, it is desirable to decrease the spot size of the particle beam.

Further, the use of helium as operation gas has been found to be beneficial due to the short wavelength and the low mass of the ions that avoids or minimizes damage of the sample during operation. Additionally, helium ion sources have a sufficiently low energy width so that chromatic aberration will not dominate limitations to the spot size. Therefore, small spot sizes are achieved but the stability of the ion beam is still a problem. It is desirable to improve the stability of the ion beam and to assure the quality of the inspection or process operation.

SUMMARY

In light of the above, a focused ion beam system according to claim 1 and a method of operating a gas field ion source assembly according to claim 10 are provided.

A focused ion beam system is provided, which is at least adapted for one of CD-measurements or DR-measurements of a specimen, including a gas field ion source, the gas field ion source having an emitter tip, the emitter tip having a base tip including a first material and a supertip including a material different from the first material, wherein the supertip is a single atom tip for emitting an ion beam, and wherein the base tip is a single crystal base tip, further including a detector for detection of backscattered and/or secondary particles released from the specimen, and an analyzer for analyzing, evaluating, and/or classifying structures on the specimen and being connected to the detector.

Further advantages, features, aspects and details that can be combined with embodiments described herein are evident from the depending claims, the description and the drawings.

A method of operating a gas field ion source assembly is provided, the gas field ion source assembly having an emitter tip with a base tip including a first material and a supertip including a material different from the first material is provided, wherein the base tip is a single crystal base tip, an electrode for providing an extraction voltage, a single emission centre by the supertip, said method includes emitting an ion beam including applying a voltage between the single emission centre of the supertip and the electrode and supplying a gas to the emitter tip, the method further includes detecting a signal released from the specimen, and analyzing, evaluating and/or classifying the structure of the specimen with the detected signal.

Embodiments are also directed to apparatuses for carrying out the disclosed methods and including apparatus parts for performing each described method step. These method steps may be performed by way of hardware components, a computer programmed by appropriate software, by any combination of the two or in any other manner. Furthermore, embodiments according to the invention are also directed to methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF THE INVENTION

Reference will now be in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of protection, in the following the charged particle beam device or components thereof will exemplarily be referred to as a charged particle beam device including the detection of secondary particles. Embodiments of the present invention can still be applied for apparatuses and components detecting corpuscles such as secondary and/or backscattered charged particles in the form of electrons or ions, photons, X-rays or other signals in order to obtain a specimen image.

Generally, when referring to corpuscles it is to be understood as a light signal, in which the corpuscles are photons, as well as particles, in which the corpuscles are ions, atoms, electrons or other particles.

Within the following description of the drawings, the same reference numbers refer to the same components. Generally, only the differences with respect to the individual embodiments are described.

A "specimen" or "sample" as referred to herein, includes, but is not limited to, semiconductor wafers, semiconductor workpieces, and other workpieces such as memory disks and the like. Embodiments of the invention may be applied to any workpiece on which material is deposited, which is inspected or which is structured. A specimen includes a surface to be structured or on which layers are deposited, an edge, and typically a bevel. The word "sample" is used synonymously for the word "specimen".

Low mass ion beam systems based on gas field ion sources (GFIS) with operating gases like helium, hydrogen, and neon have the potential required for high precision measurement tools like CD, such as line and gap width, edge roughness, hole diameter, shape accuracy and the like, and DR. DR is for instance about finding deviations from predefined structures, particles and particle analysis regarding shape, material etc. These devices can overcome the limitations of diffraction due to their shorter wavelength. GFIS with their high brightness can afford enough current, typically in the range of a few pico-amperes in sub-nanometer spot sizes. The resolution of these measurement tools is improved as compared to the resolution acquired with electron beam tools. Values of a few tenths of a nanometer or below are desirable. Accordingly, embodiments described herein, allow for spot sizes of 0.5 nm and below, e.g., at beam energies of typically 1 keV to 70 keV. With further optimized systems, spot sizes of about 0.1 nm are possible under optimized conditions.

However, for CD and DR applications with the above mentioned resolution, it is important that the particle beam is stable. A spot size of below 1 nm, e.g. about 0.1 nm, shows desired benefits, when the stability of the current is within a certain range. This range is typically less than 10%, more typically less than 5%, and even more typically less than 2% or 1%. Therefore, the improvement of the beam stability is desirable and several arrangements arise from this situation, as in detail described below. Each of them or each combination of them is capable of effecting an improvement of the operation stability.

Generally, it is possible to improve the physical characteristics of the charged particle beam device such as providing several atoms at the end of the emitter tip of a GFIS, for instance a trimer GFIS having three atoms. On the other hand it is possible to improve the operation of the charged particle beam device indirectly, by providing e.g. a control loop to further control the operation characteristics.

According to embodiments describe herein, a stable generation of the charged particle beam can be provided. The improved probe current stability allows for increased measurement accuracy, in particular for the applications referred to herein.

The stability of the generated ion beam and the continuously available accuracy of sample inspection is a problem to be solved for ion beam devices. The resolution of known GFIS-tools is, inter alia, limited by the above mentioned current stability which affects measurement accuracy. It has been found that the current stability is partly influenced by the emitter tip of the source. E.g., in the case of a trimer three beam sources compete for the gas supply, which can result in instabilities. Further influences have been found to be disturbances in the gas supply. For example, absorbents in the vicinity of the emitter tip might act as an additional emission source in light of the local field enhancement. This influences, e.g., transport of the gas to the emitter tip itself. Yet further influences that have been investigated are residual gases, which might change the geometry of the emitter tip shank. Accordingly, according to some embodiments, which can be combined with other embodiments an improved emitter tip with a single atom emission center that can be manufactured to be less fragile and unstable is provided for CD and DR applications.

Further, according to some embodiments described herein and which can be combined with other embodiments described herein, a beam current control is provided and including a beam current measurement device, e.g. by measuring the beam current or the current provided to the emitter. Thereby, a beam current device can measure the beam current in the column or the current provided to the emitter and, thus, emitted from the emitter. In the latter case, according to some embodiments, which can be combined with other embodiments described herein, the beam current measurement device can include an emission current measurement device.

The probe current control allows the detection of probe current changes, and triggering accordingly the stabilization of the probe current. According to some embodiments, a control loop can trigger a probe current control action.

In addition or alternatively thereto, it has been proved that the sample charge has an influence on the operation quality too. Charging of the sample can cause irregularities in measurement accuracy. Therefore, a focused ion beam device with a sample charge control is provided. The sample charge control includes a sample charge measurement unit that creates a signal according to the sample charge and triggers countermeasures.

Figure 1:
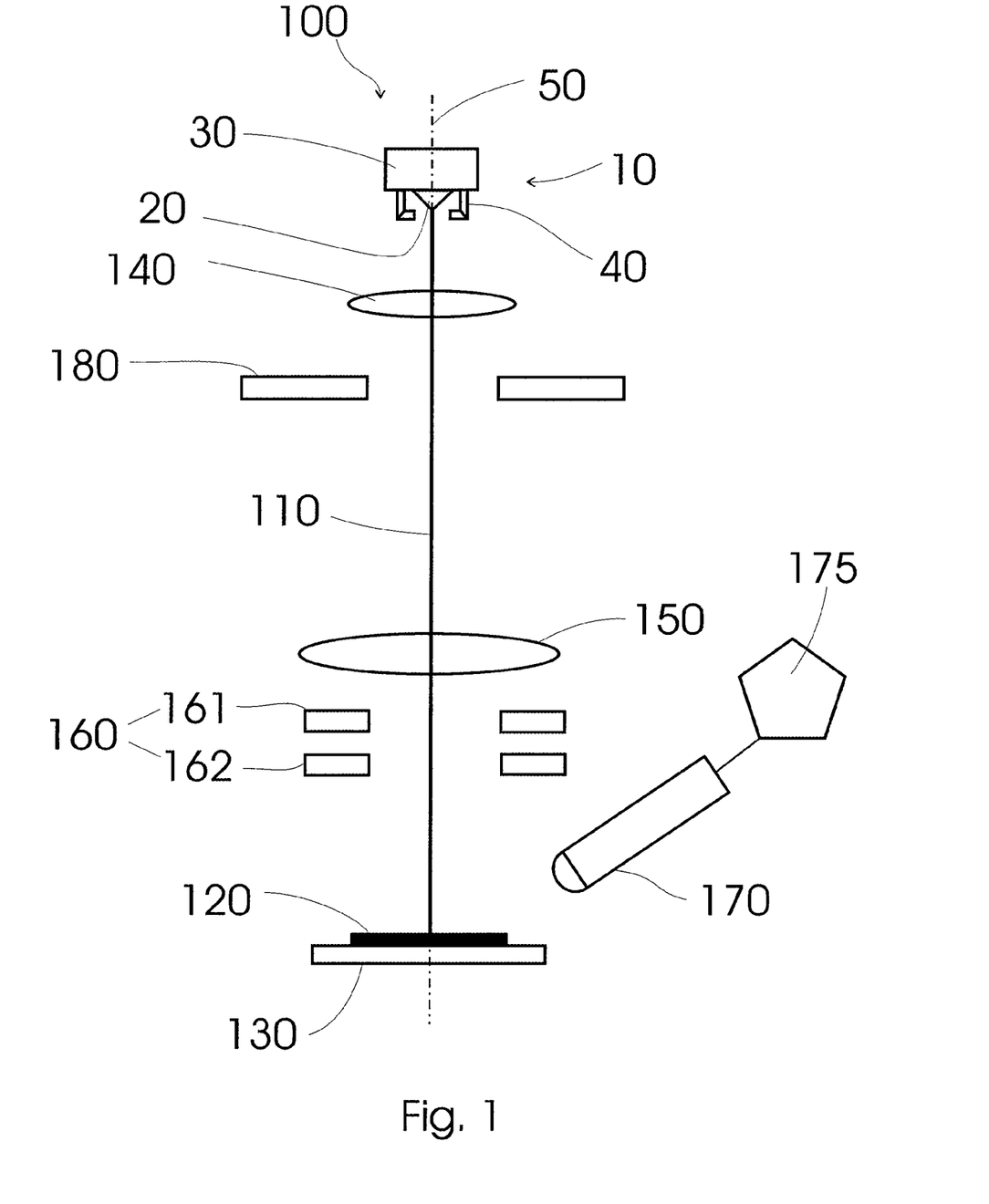
FIG. 1 shows a schematic view of a focused ion beam device according to embodiments described herein.

FIG. 1 shows a schematic view of a focused ion beam device 100. The focused ion beam device 100 includes a charged particle gun 10 having a gun base 30, an emitter 20 and an extractor 40. According to embodiments described herein, the charged particle gun 10 is a gas field ion gun. Gas is supplied to the emitter 20 and an ion beam 110 is generated. The charged particle beam 110 passes through a condenser lens 140 and an aperture 180. A deflector unit 160 may include one or more deflectors 161 and 162 and directs the ion beam 110 to the specimen 120. The beam is focused on the specimen 120 on the specimen support 130 by objective lens 150. Secondary and/or backscattered particles released from the specimen by the impingement of the charged particles trespass the detector 170. According to some embodiments, the detector 170 can include a scintillation element. An analyzer 175 processes the data received from the detector.

Generally, it is possible according to some embodiments that the primary charged particle beam 110 is decelerated by an appropriate potential of the specimen and the secondary and/or backscattered charged particles are accelerated away from the specimen 120 towards the detection unit.

Figure 2A:
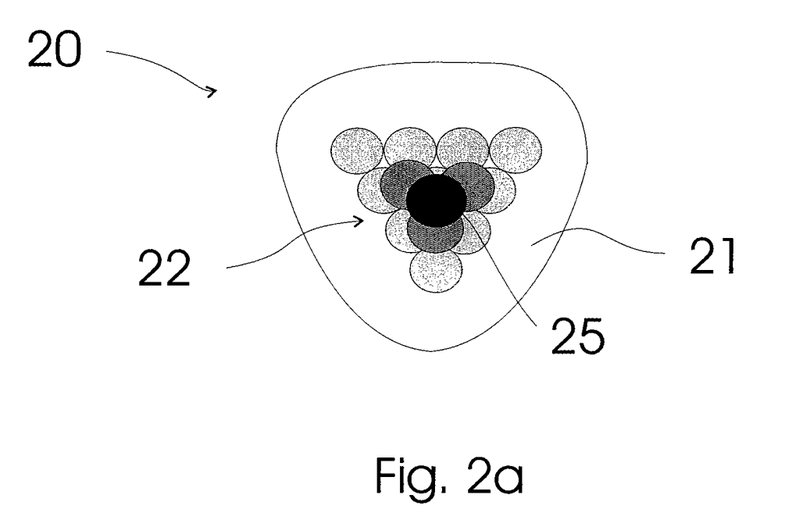
FIG. 2a shows a schematic detailed view of the emitter tip according to embodiments described herein.

According to embodiments described herein, the emitter 20 includes an emitter base tip and an emitter supertip. FIG. 2a shows a detailed top view of the construction of the emitter 20. The ion beam is emitted from the emitter supertip 22. The emitter base tip 21 includes a material that is different from the material of the supertip 22. According to embodiments described herein, the supertip 22 has one single atom 25 at its end. According to some embodiments described herein, which can be combined with other embodiments described herein, the base tip 21 can be a single crystal base tip.

As can be seen in FIG. 2a, the single atom tip 22 provides at its top only one atom 25. The number of atoms in the adjacent layers of the single atom depends on the production process and the production conditions of the emitter tip.

According to some embodiments that can be combined with other embodiments, the supertip is produced by a coating of the base tip. According to some embodiments, the base tip can be a single crystal metal base tip. For instance, a thin tungsten single crystal tip can be coated with a palladium layer that has a thickness of about one, two or more palladium atom layers. According to other embodiments, the base tip may include materials like tungsten, tantalum, rhenium, molybdenum, niobium, and more refractory metals. According to yet further embodiments, which can be combined with other embodiments described herein, the supertip may contain materials including platinum, rhodium, iridium and palladium.

According to some embodiments that can be combined with other embodiments described herein, the coating of the base tip has a thickness of typically one, five or more atoms, more typically from one to three atoms. Typically, the supertip 22 is made of a material different from the material of the base tip 21. Accordingly, some layers being located under the single atom 25 of the coating of the supertip may contain one or more atoms from the material of the base tip 21. For instance, the supertip 22 is made of platinum and the base tip 21 is made of tungsten. Thus, some layers contain only platinum atoms, whereas some layers being located under the platinum layers may include tungsten atoms, too, due to the thickness of the platinum coating on the tungsten base tip. According to some embodiments, the different layers may contain only one type of atom, i.e. either only tungsten or only platinum.

Figure 2B:
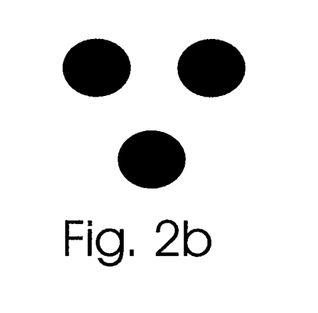
FIG. 2b shows a schematic view of an emission pattern according to the prior art.

In FIG. 2b, the emission pattern of a particle beam device as known in the prior art is shown. The emitter tip in the prior art sources has, for instance, three or more atoms. FIG. 2b shows an emission pattern coming from a particle device with an emitter having three atoms at its tip, known as a trimer. The trimer emits charged particles in three separate beams. Only one of these three beams is used in order to limit aberrations of the lenses. Thus, the three beams coming from the trimer emitter tip "compete" for the gas supplied to the emitter tip. Every small disturbance of the system changes the ratio between the currents in the beam and accordingly the probe current.

As mentioned above, disturbances in the gas supply influence the trimer tip emission. For instance, adsorbents next to the tip can start charged particle emission due to a local gas field enhancement. This reduces the gas transport to the trimer tip and consequently reduces the emission current. Another problem is that residual gases cause changes in the geometry of the tip shank, which influences field strength at the end of the tip and which results in emission current and consequently in probe current changes.

According to embodiments described herein, the presented measurement device for CD and DR applications can overcome these limitations by building up a supertip on a single crystal base tip. A stable charged particle source with a one-atom tip can be provided which avoids the disadvantages of the trimer configuration mentioned above.

Figure 2C:
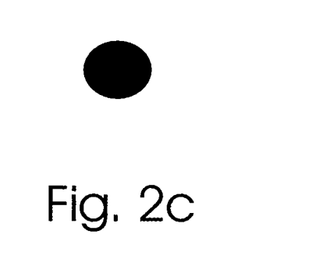
FIG. 2c shows a schematic view of an emission pattern according to embodiments described herein.

In FIG. 2c, the emission pattern of a measurement device according to embodiments described herein is shown. A tip which has only one emission centre, that means only one atom at its top, makes the problem of competing ion beams irrelevant.

According to some embodiments described herein, the base tip can be a single crystal base tip. A single crystal does not have grain boundaries. This can be beneficial with regard to mechanical and electrical properties of the base tip, such as thermal conductivity, creeping, precipitation, and corrosion. The production of the single-atom tip is simplified and its functionality improved.

Moreover, the stability of the single-atom supertip and the stability of the ion beam generation are increased by the construction according to embodiments described herein.

According to embodiments described herein, a method of operating a gas field ion source assembly is provided. The gas field ion source includes an emitter tip, an electrode and a single emission centre. The emitter tip is made of an emitter base tip and a supertip. The material of the base tip is different from the material of the supertip. A voltage is supplied between the single emission centre of the supertip and the electrode. Furthermore, a gas is supplied to the emitter tip and the emitter tip surrounding region. Accordingly, an ion beam is generated coming from the single emission centre and including ions of the operation gas. As a consequence of the emitter tip construction, only one stable ion beam is generated and directed to the sample. Typically, a specimen is analyzed with the ion beam and the structures of the specimen are classified by an analyzer. According to embodiments described herein, a controller can utilize the output of the analyzer. Thereby, the controller may act on the focused ion beam device or may feed forward or feed back the CD or DR information to other apparatus, which are provided in an in-line system, into which the focused ion beam is integrated.

Generally, according to some embodiments, which can be combined with other embodiments described herein, the focused ion beam device can be integrated in a semiconductor manufacturing system, such that an in-line focused ion beam device is provided. Thereby, in particular CD-measurements or DR-measurements can be provided, which can be used for feed back or feed forward of the analysis of the specimen.

According to embodiments described herein, the single emission centre is provided by a single-atom supertip. According to some embodiments, the base tip is a single-crystal base tip. According to other embodiments that can be combined with embodiments described herein, the base tip and/or the supertip are made of metal. Typically, the operation gas is helium, hydrogen, neon or the like.

According to embodiments described herein, a controller may also control, among other things, the probe current. The controlling of the probe current may include a probe current measurement that can be accomplished by means for measuring the probe current like a Faraday cup, a biased Faraday cup, an electrode, a biased electrode, an inductive measurement unit, a scintillation detector, a combination thereof, or the like. The probe current measurement device generates a signal to trigger compensation actions to assure a stable probe current impinging on the sample and a proper function of the ion beam device. According to embodiments that can be combined with other embodiments described herein, the sample charge is controlled. The charge control includes sample charge measurement. A retarding field configuration can be arranged to measure the sample charge. The measurement signal is used to calculate and cause countermeasures if necessary.

According to embodiments that can be combined with other embodiments described herein, the method includes a control loop to control the probe current and the countermeasures. Also, a control loop for the sample charge control is provided.

According to embodiments described herein, a focused ion beam device with the probe current control is provided. A focused ion beam device with a probe current control can detect probe current changes and/or can initiate probe current stabilization measures for high precision measurement tools, like CD and DR. As the spot size of the ion beam can be in a range by 0.1 nm, the focused ion beam device requires a current stability which can be improved by the control of the probe current. This is even more desirable as the probe stability affects the measurement and imaging accuracy.

Figure 3A:
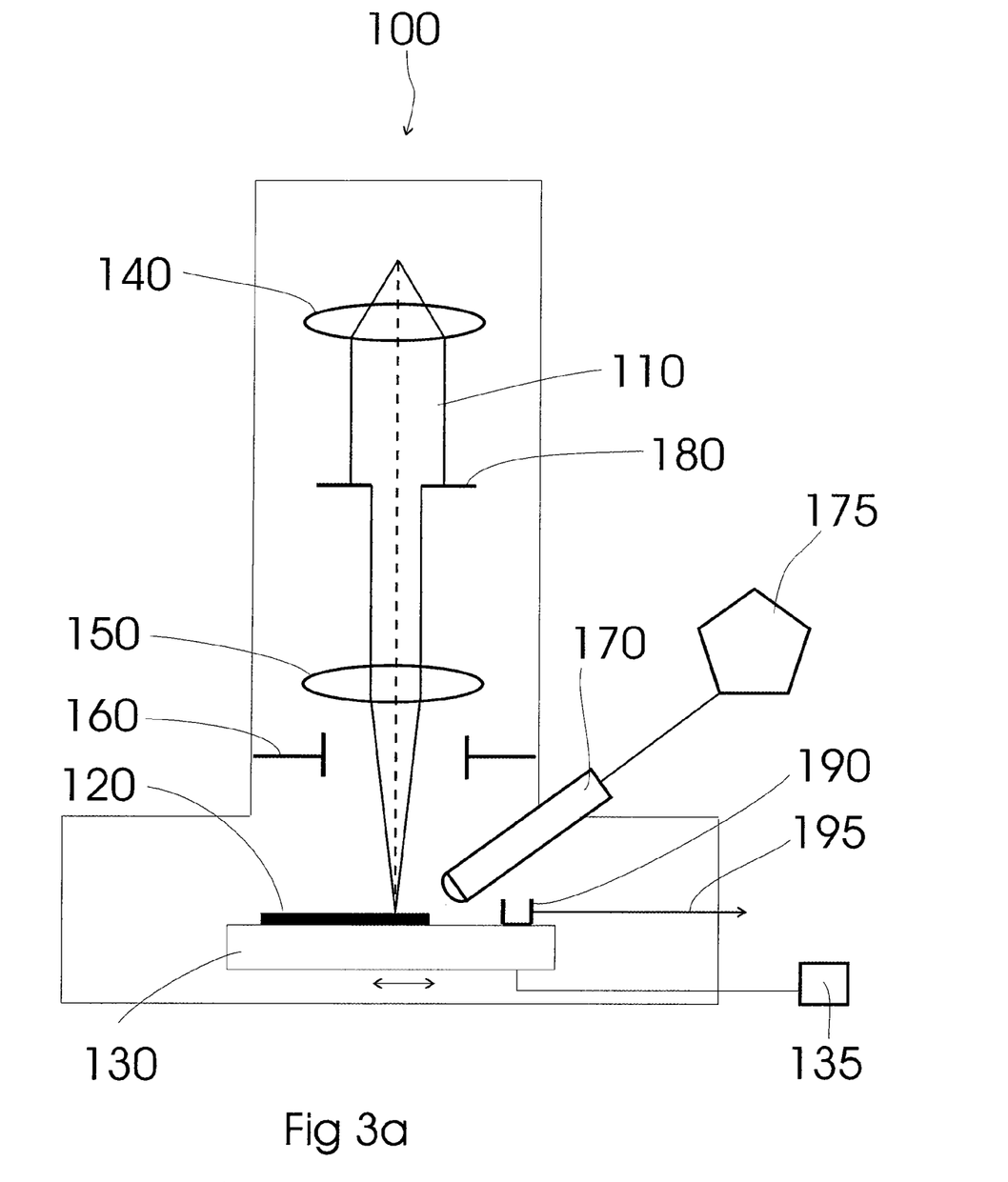
FIG. 3a shows a schematic view of a focused ion beam device according to embodiments described herein.

FIG. 3a shows a schematic view of a focused ion beam device 100 with a probe current control and an analyzer 175 according to some embodiments described herein. An ion beam 110 is generated in a gas field ion source (not shown) including an emitter. Typically, the emitter is composed of an emitter base tip and an emitter supertip. Gas is supplied to the emitter region surrounding the emitter. According to embodiments described herein, the gas can be helium, hydrogen, argon, neon or the like. An extraction voltage is supplied to the emitter and causes the emitter to emit an ion beam including ions of the gas present in the emitter region.

The ion beam 110 passes a condenser lens 140 that reduces the divergence or focuses the ion beam 110 coming from the ion beam source. Further, an aperture 180, where a portion of the ion beam 110 is blocked in order to shape the ion beam 110, is provided. According to embodiments described herein, the beam further passes an objective lens 150 before being deflected by a scan deflector 160. The scan deflector scans the ion beam 110 over the area of the specimen 120 that has to be inspected, measured, analyzed, manipulated, or the like. The specimen 120 is located on a specimen stage 130 that is controlled by the specimen stage control 135. Therefore, the sample stage 130 can be moved for having the scan area in the desired image region.

Further, according to embodiments that can be combined with other embodiments, the focused ion beam device 100 includes further beam optic elements, which can be one or more elements selected from the group consisting of: scanning deflectors, stigmators, focus adjustment units or focusing units for adjusting the focus of the ion beam, alignment deflectors, condenser lenses, accelerating electrodes or tubes for providing a beam boost potential (e.g., an increased potential in the column), or the like.

The ion beam 110 impinges on the specimen 120. From the specimen, secondary and/or backscattered particles are released. The secondary and/or backscattered particles, which are hereinafter referred to as secondary particles travel to the detector 170. According to embodiments described herein, the detector 170 generates a signal on impingement of the secondary particles, which is used for image generation during operation of the focused ion beam device. According to some embodiments, the detector 170 includes a scintillator.

According to embodiments described herein, the detector 170 passes the signal and the information of the specimen to an analyzer 175. The analyzer is able to analyze and classify the structures present on the specimen. For instance, the analyzer can identify shapes such as circles, paths, trunks or the like, but also different materials being present on the specimen. Further, according to embodiments which can be combined with other embodiments described herein, the analyzer may detect exact dimensional values of the surface of the specimen, such as values for height, angle and dimensions of the structures of the specimen. Typically, the analyzer is a computer with hardware- and software components, allowing the execution of the above mentioned identification automatically.

According to some embodiments, the control of the probe current includes the measurement of the probe current with a beam current measurement device. Typically, the beam current measurement device is part of the focused ion beam device including the gas field ion source-column and a sample chamber with the sample and a sample stage. According to embodiments described herein, the current measurement device can be part of the column, in order to allow monitoring current changes frequently. This has the benefit that no time consuming sample stage movements are required. Accordingly, some embodiments described herein, include optionally a beam current probe measurement during line or image fly back time and/or during stage movement from one measurement area on the specimen to another specimen area on the specimen. According to another alternative or additional embodiment, the current changes can be controlled on request.

According to embodiments described herein, the signal of the measured probe current is used to trigger counter measures to influence and correct the probe current. In case the probe current is measured frequently, the countermeasures are carried out if it is indicated by the signal. According to some embodiments, the probe current can be measured continuously during the operation of the focused ion beam device. In this case, the countermeasure can also be applied continuously and only the amount of the countermeasure is amended according to the measured signal.

According to some embodiments, the current measurement device can be a Faraday cup or another ion beam sensitive device. In FIG. 3a, an ion beam sensitive device 190 in the form of a Faraday cup is shown. The ion beam sensitive device is located on the sample stage and provides a current signal 195.

Figure 3B:
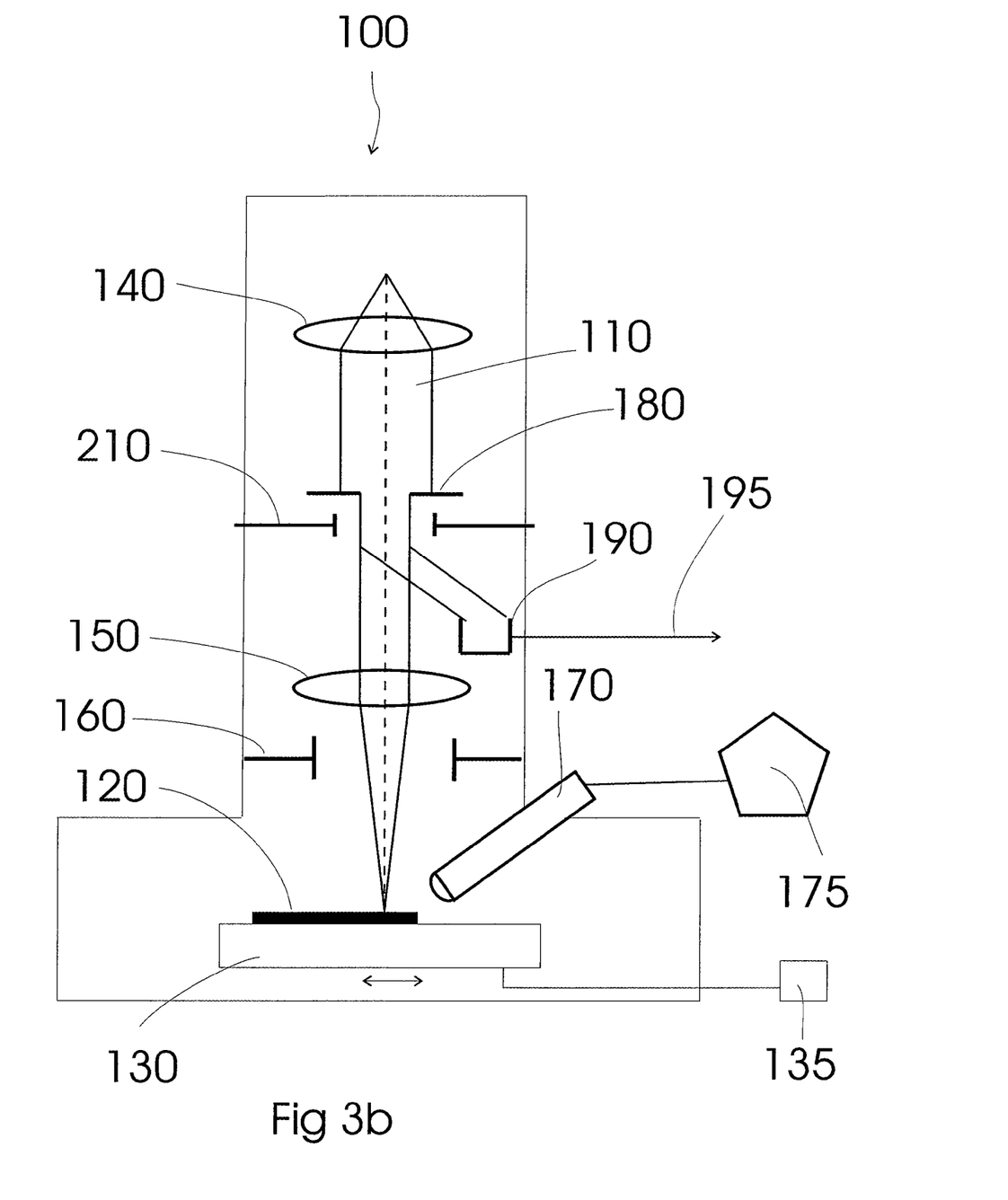
FIG. 3b shows a schematic view of a focused ion beam device according to other embodiments described herein.

According to another embodiment described herein, FIG. 3b shows an ion beam sensitive device 190 in the form of a Faraday cup located within the beam column. Typically, the beam measurement device 190 is located behind the beam limiting aperture 180 to measure the probe current that in fact reaches the sample. A deflector 210 directs the ion beam 110 towards the ion beam sensitive device 190 that generates a current signal 195.

Figure 3C:
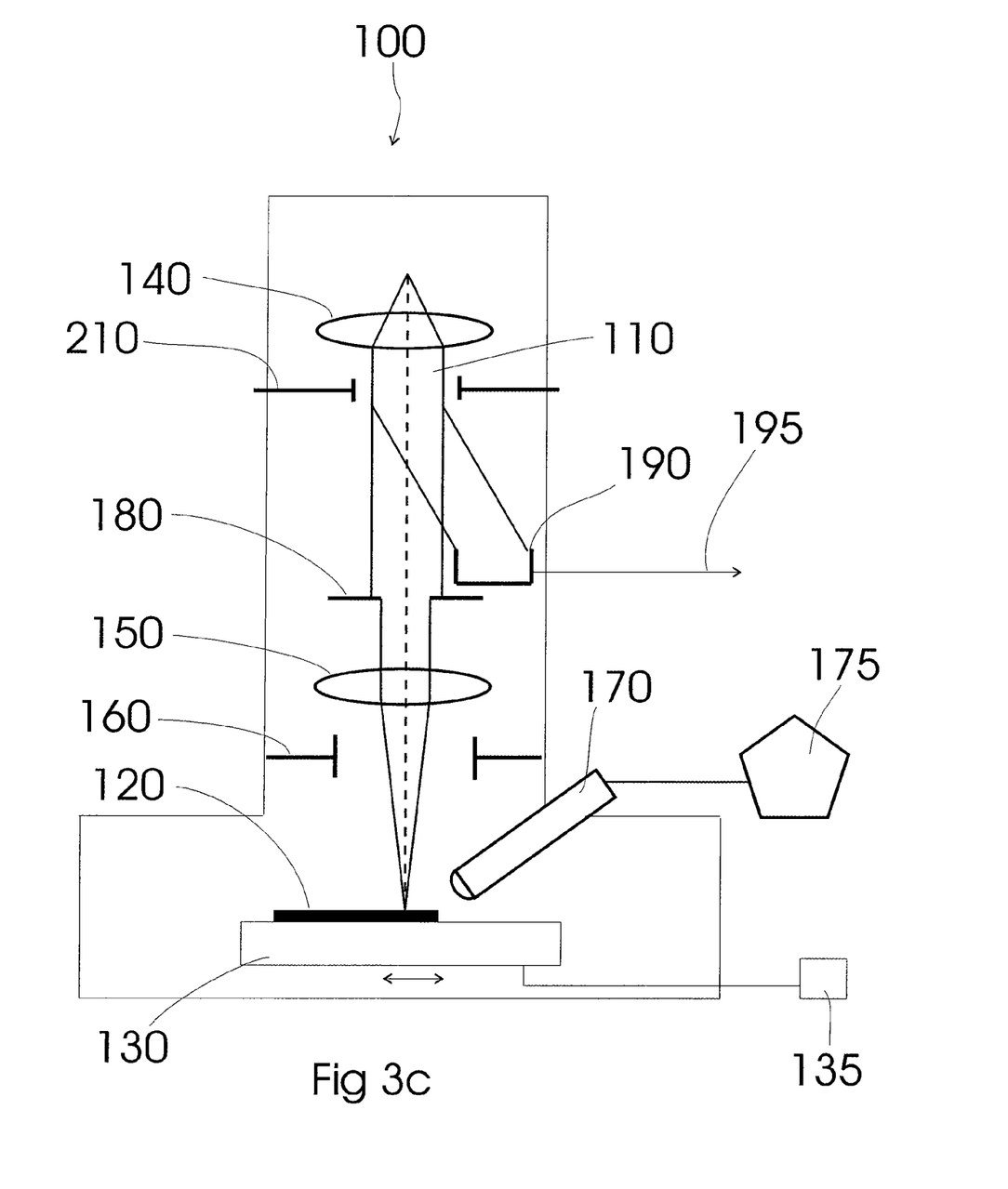
FIG. 3c shows a schematic view of a focused ion beam device according to yet another embodiment described herein.

FIG. 3c shows yet another embodiment described herein, where the ion beam sensitive device is located before the aperture 180. According to embodiments described herein, the beam current can be measured before reaching the aperture 180 in case the correlation between the current at this position and the final probe current is sufficient for the probe current control. As described above, a deflector 210 directs the ion beam 110 to the beam sensitive measurement device. Thereby, a current signal 195 is generated by the measurement device 190. Thereby, measuring a probe current according to any of the described measurement procedures, before a beam limiting element, increases the signal to be measured. The final current on the specimen might then be calculated based on a calibration or a calculation.

According to embodiments which can be combined with other embodiments described herein, the deflector 210 can be an electrostatic deflector. Preferably, the deflector is combined with a beam blanker. According to embodiments described herein, the beam blanker may be used as a deflector for current measurement. Typically, the beam blanker clears the beam, whenever a sample signal is not required.

Figure 3D:
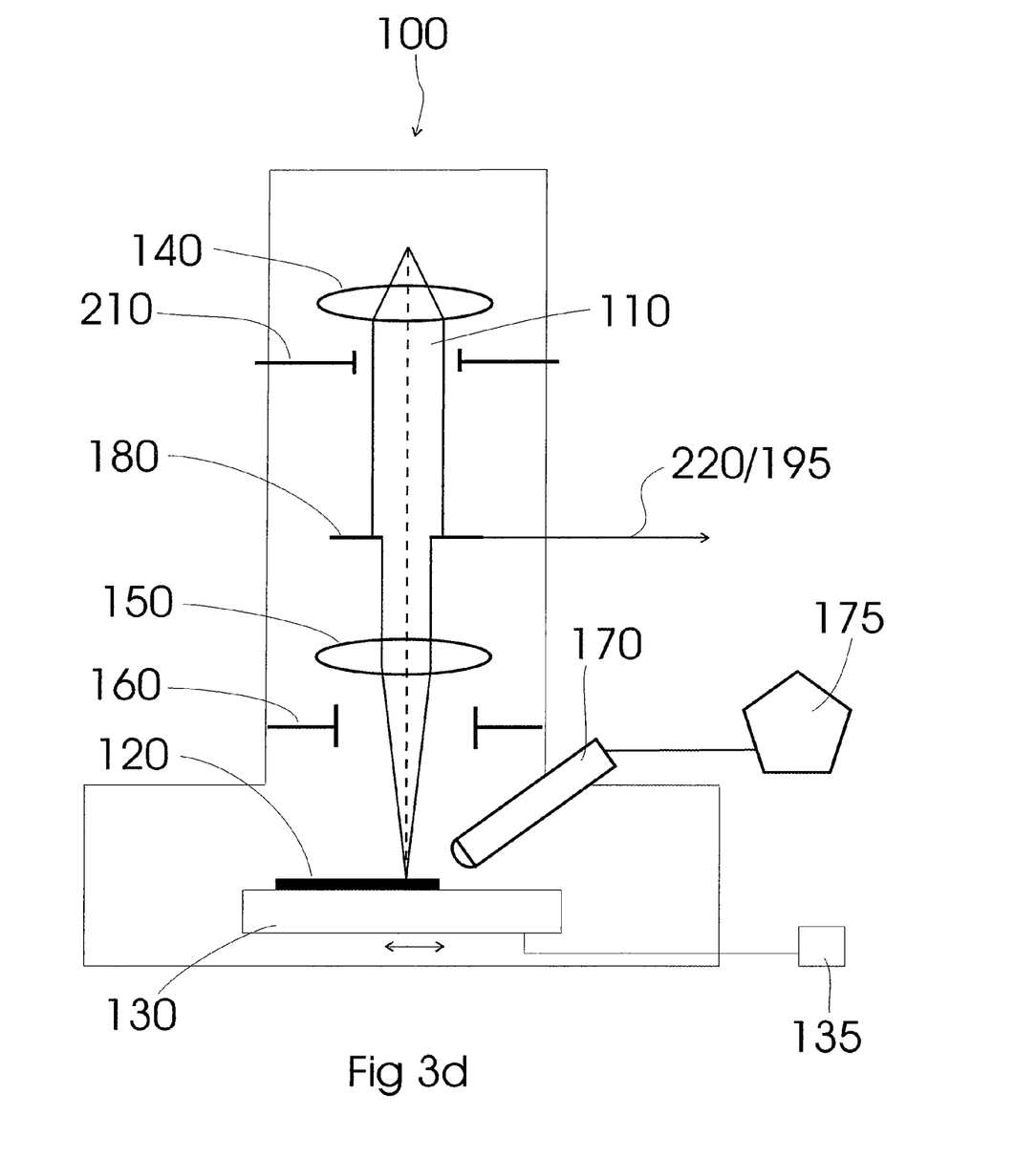
FIG. 3d shows a schematic view of a focused ion beam device according to yet another embodiment described herein.

FIG. 3d shows yet another embodiment of the focused ion beam device. In this embodiment that can be combined with other embodiments described herein, the beam limiting aperture 180 is suitable or adapted for accepting the measurement device. Typically, the aperture 180 can be the beam measurement device and can provide a current signal 195. According to some embodiments, the emission current supplied to the emitter tip can be measured in the voltage supply for the emitter tip of the GFIS, e.g., a HV supply for the GFIS, and can be used as a control signal.

According to yet other embodiments, a beam current measurement assembly can include a beam modulation unit for repeatedly changing the current of the charged particle beam for providing a modulated charged particle beam, and a measurement unit adapted for measuring an inductive signal generated by the repeatedly changing charged particle beam current. Thereby, according to more detailed embodiments, which can be combined with other embodiments described herein, the measuring unit can be provided by a conductive loop in the vicinity or typically around the charged particle beam. Basically such an arrangement might be interpreted as a transformer in which the modulated charged particle beam is the primary coil (having one winding) and having a secondary coil or a magnetic circuit around the charged particle beam.

According to some embodiments described herein, the probe current measurement requires a stage controller in case that the measurement device is on the stage as shown in FIG. 3a. An actuator may also be provided to move an in-column current measurement unit in the event an in-column measurement device is moved mechanically. Furthermore, a deflection device, for instance an electrostatic deflector, is provided which directs the beam to the in-column measurement device or the measurement device on the specimen stage.

Figure 4:
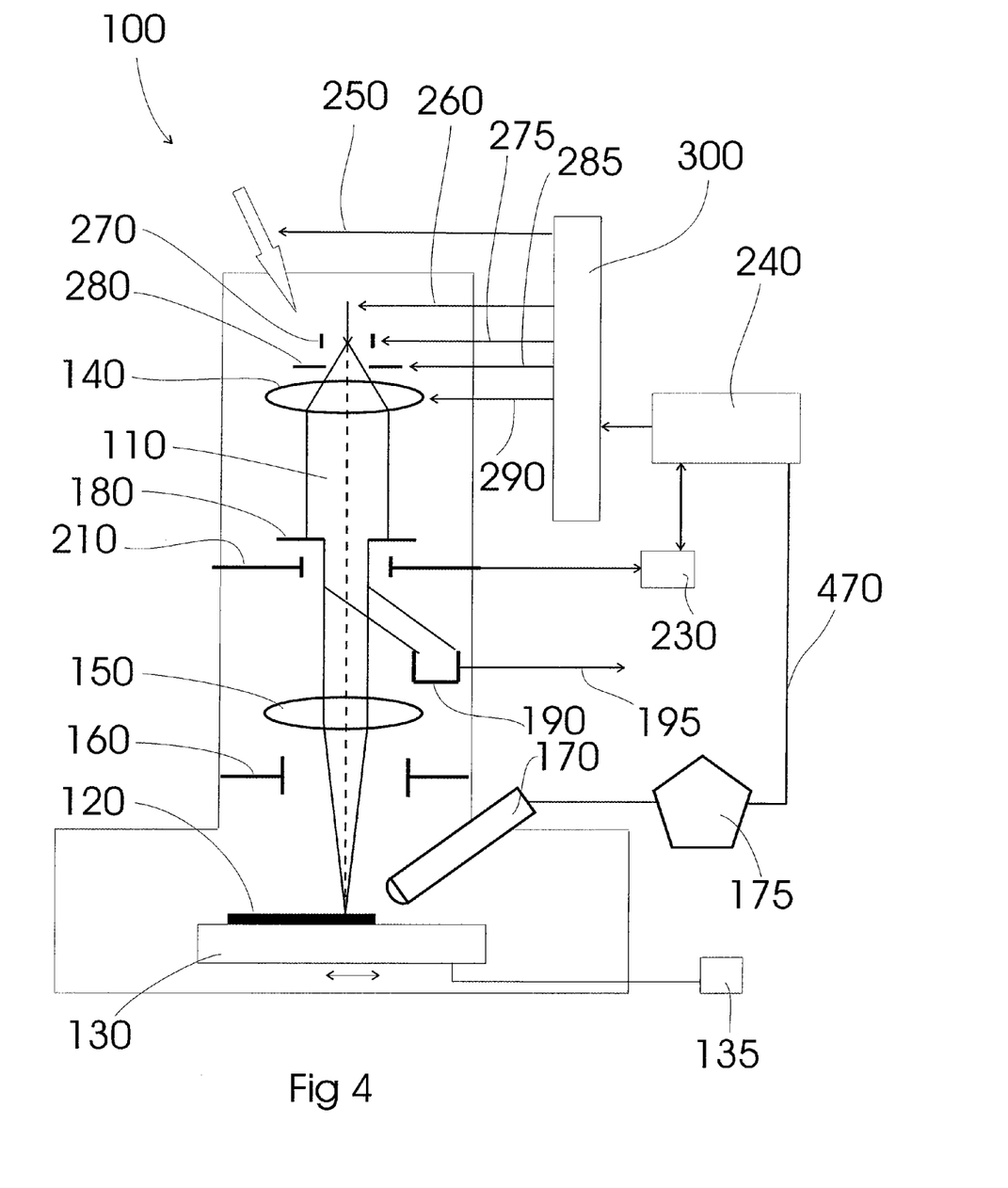
FIG. 4 shows a schematic view of a focused ion beam device controlled by a control loop according to embodiments described herein.

In FIG. 4 several control mechanisms and a control unit is shown to control the beam current. According to embodiments described herein, the beam current is measured as described above. To influence the beam current, a control unit 240 is provided. The control unit 240 interacts with the deflector control 230 and the control loop 300. According to some embodiments that can be combined with other embodiments described herein, the control unit includes a calculation unit. The calculation unit calculates the necessity of countermeasures when the probe current changes. This may be done by comparing the probe current to threshold values according to look-up tables or the like.

Typically, the control unit 240 can automatically execute the controlling. According to embodiments described herein, the control unit may also be able to control the further steps of the operation. Thus, according to some embodiments, results from the analyzer can be used for adapting operation of the focused ion beam device. According to yet further embodiments, the controller may alternatively or additionally be connected to other devices in an in-line semiconductor manufacturing tool. Thereby, the information from the analyzer can be used by the controller to provide desired information to other devices. The controller may calculate the necessary measures according to the output of the analyzer 175. According to embodiments described herein, the output of the analyzer may include information about the correctness of the structure on the specimen.

According to embodiments that can be combined with other embodiments described herein, the control unit 240 can control the sort of action the control loop 300 should fulfill. According to another embodiment, the control unit 240 can control the amount of action of the control loop 300. According to yet another embodiment, the control unit 240 initiates the control loop 300 without limiting the control loop action in any way. According to some embodiments which can be combined with other embodiments described herein, the control unit may also initiate specimen change if necessary or direct the inspected specimen to another device being able to modify the specimen in case that the analyzer gives information, which indicates that a modification of the specimen should be conducted. Alternatively, the specimen does not have to change the device for being structured but may also be structured in the same device.

The control loop 300 can automatically control changing of the emission current. According to some embodiments that can be combined with other embodiments described herein, the control loop receives instructions from the control unit 240. These instructions may include the necessity of countermeasures, the sort of countermeasures or the amount of countermeasures.

According to embodiments described herein, the control loop can control one or more of the group including the gas flow 250, the temperature of the emitter 260, the suppressor voltage 275, the extractor voltage 285, and the condenser excitation 290. By controlling the temperature of the emitter and the emitter tip, the amount of gas is controlled that is condensed on the emitter and the emitter tip. The suppressor electrode 270 allows controlling field extraction strength indirectly and allows therefore controlling the emission current that correlates with the probe current. For example, in FIG. 4, a suppressor 270 in the form of an additional electrode is provided next to the gas field ion source. Another possibility to control the emission current is changing the extraction voltage. According to yet further additional or alternative implementations described herein, the condenser lens excitation can be controlled. Thereby, the probe current density on the aperture 180 is influenced.

According to other embodiments described herein, the detection channel can be calibrated to compensate the detector signal according to the probe current change to achieve improved measurement accuracy. The detection channel in this context should be understood as image generation measurement signals based on detection of secondary particles from the specimen or the like.

According to yet further embodiments, which can be combined with other embodiments described herein, further sample charge measurement, sample charge control, and/or sample dosage control may be provided. During operation of the focused ion beam device, ions impinge on the sample. In case ions are used as particles, the sample will be charged positively due to the ion impingement. This charging can influence the imaging of sample details and their quantitative dimension measurement in a negative manner. Typically, the sub-nanometer resolution can no longer be ensured. Therefore, the measurement of the surface charge of the sample during imaging, measuring or processing is provided.

According to embodiments that can be combined with other embodiments described herein, the focused ion beam device can include a sample charge control. Typically, the sample charge control contains a charge measurement device. Even more typically, the charge measurement device includes an energy sensitive detector, such as a spectrometer. Providing a spectrometer within the detection path allows surface voltage measurement of the sample. The term "detection path" in this context should be understood as the path between the sample surface and a detection arrangement, for instance a detector. Typically, the received charge measurement can be used to trigger compensation measures.

In order to further reduce the sample charge, further measures can be provided. According to embodiments described herein, a beam blanker is provided that blanks the ion beam when a sample signal is not required, e.g., during line fly back, image fly back or an idle period of the system. This reduces the sample dosage and therefore sample charging. By reducing the sample charge, the measurement and imaging accuracy is improved. According to some embodiments that can be combined with other embodiments, the beam blanker can be used and combined as a deflection device for current measurements described above. Thereby, it might be possible that during beam blanking, the probe current is measured and the current changes are compensated.

According to some embodiments, a retarding field configuration is used to measure the sample charge and create a signal according to the sample charge. A retarding field configuration is for instance shown in FIG. 5a. Typically, the retarding field configuration is located within the signal detection path.

According to embodiments described herein, a retarding field configuration can include a retarding field detector and an electrode. The electrode can be an aperture or a grid or the like located between the sample surface and the detector. In case the sample is charged positively, the electrode is biased negatively and can act as a filter for secondary particles. Secondary particles with energy below a certain threshold value cannot pass the electrode. The remaining particles with energy above the threshold value can pass the filter electrode and are detected by the detector.

Figure 5A:
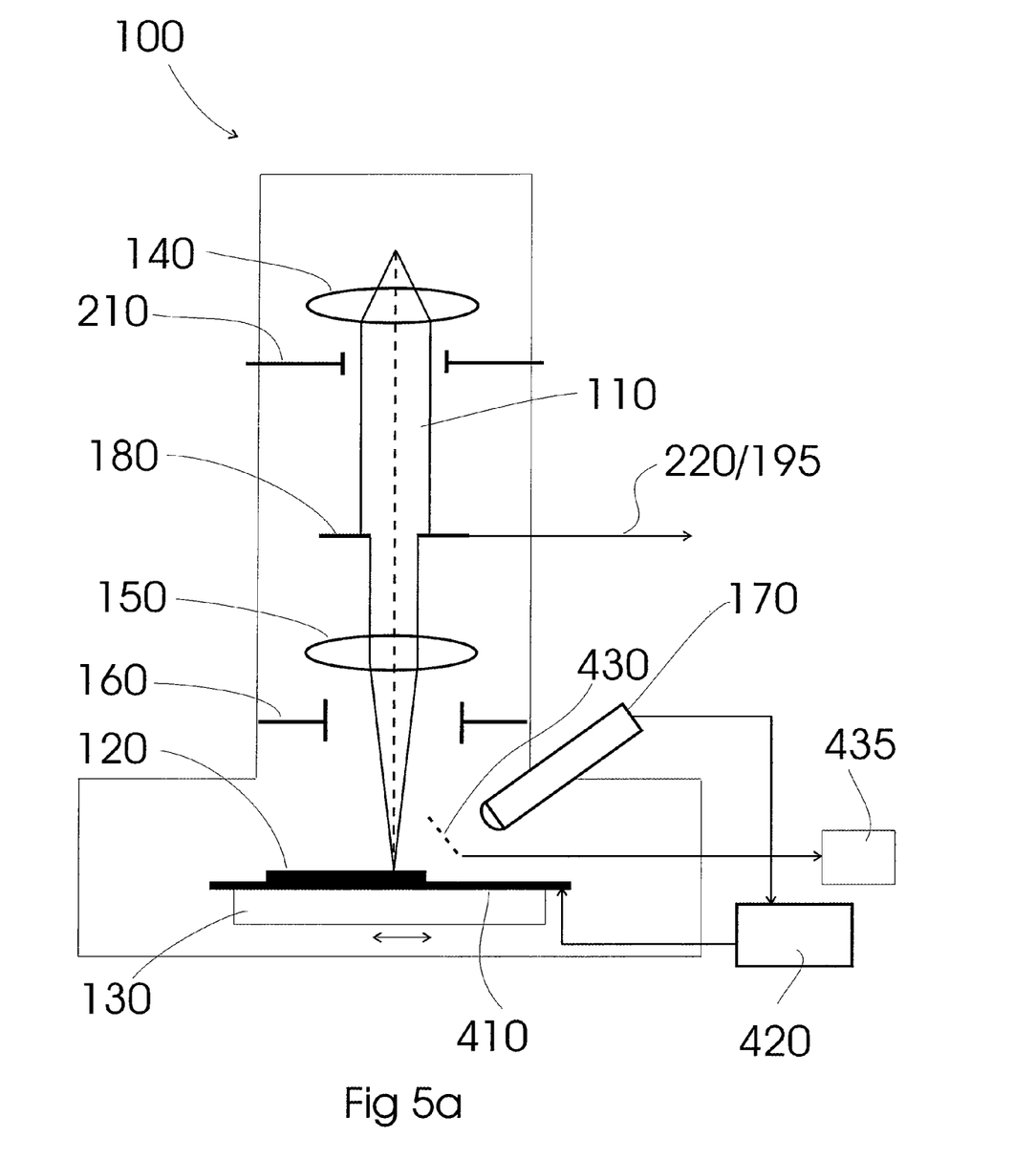
FIG. 5a shows a schematic view of a focused ion beam device with a filter electrode according to embodiments described herein.

In FIG. 5a a post-lens arrangement of a retarding field configuration is shown, that means, the retarding field configuration or only the filter electrode is located beneath the objective lens. A filter electrode 430 is placed between sample 120 and detector 170. The electrode control 435 controls the energy supplied to the electrode to maintain a negative charging that corresponds to a predetermined threshold value for the energy of the secondary particles that should be filtered. Further, a sample charge device 410 is provided. The secondary particles travel from the sample to the electrode and pass the filter electrode 430 if their energy is high enough. The detector 170 detects the filtered particles and generates a signal. The signal can be used to determine the surface voltage, e.g. by look-up tables or by using feedback loops keeping the detector signal constant. This signal is forwarded to the control unit 420 that calculates the necessary compensation measure and controls the sample charge device 410. The sample charge device provides energy to the sample according to the instruction received from the control unit 420. Therefore, the sample charge resulting from the impingement of the ions can be compensated. The configuration of FIGS. 5a and 5b can be combined with embodiments described herein, but for the sake of simplicity, for instance the analyzer and the control unit is not shown in these figures.

Figure 5B:
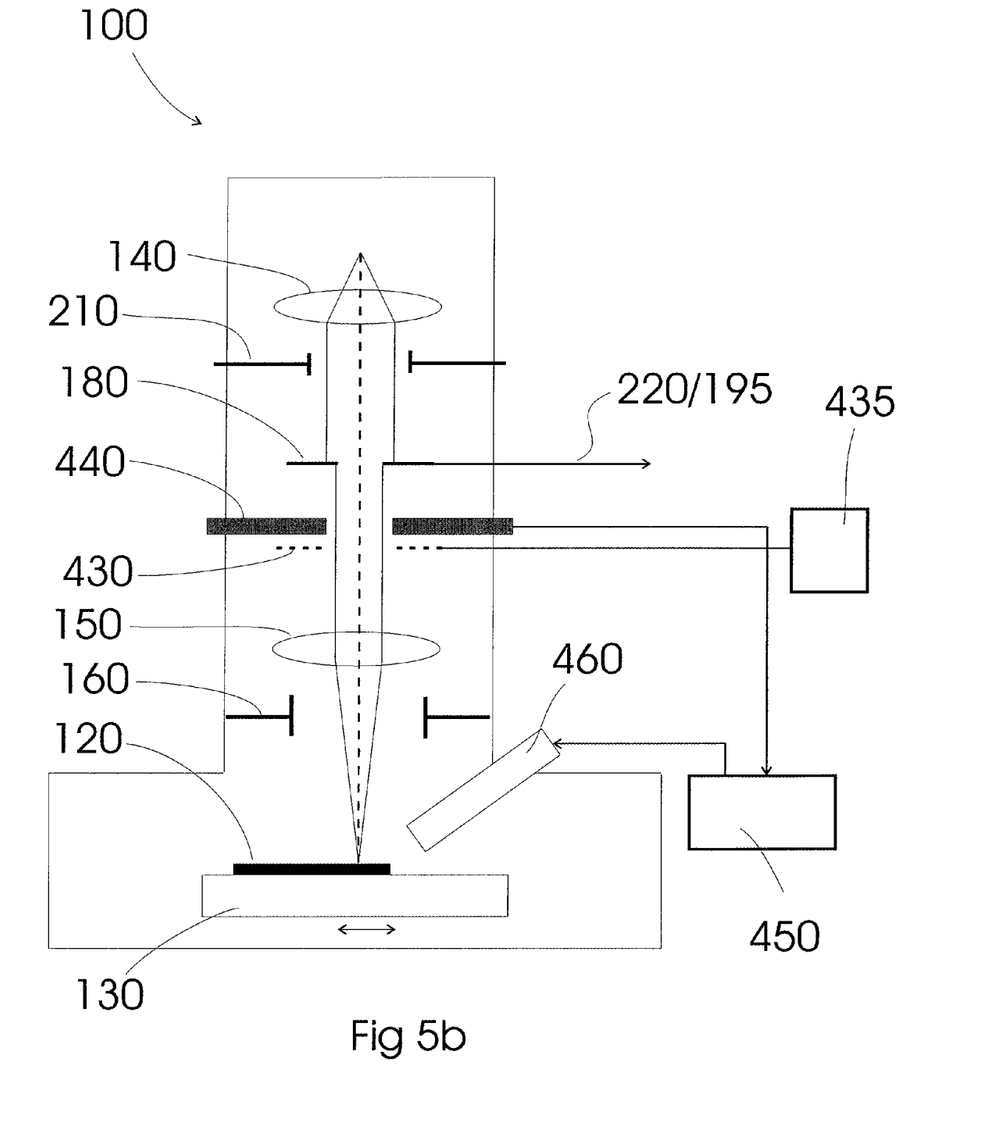
FIG. 5b shows a schematic view of a focused ion beam device with a filter electrode according to another embodiment described herein.

In FIG. 5b, another embodiment of the focused ion beam device with a sample charge control is shown. The retarding field configuration is arranged in a pre-lens arrangement. The term "pre-lens arrangement" in this context should be understood as an arrangement that is located above the objective lens 150. The filter electrode 430 is charged negatively in order to filter secondary particles having certain energy. The charging of the filter electrode is controlled by an electrode control 435. A detector 440 is provided to detect the filtered secondary particles coming from the sample and filtered by the electrode 430.

According to some embodiments, the retarding detector can be for instance ring-shaped or segmented. In FIG. 5a, an off-axis detector is shown, that means, the detector is arranged next to the optical axis, i.e., essentially the ion beam axis. In contrast thereto, FIG. 5b shows an on-axis configuration. Being arranged in an on-axis configuration means that the detector is orientated on the axis of the ion beam. The term "off-axis arrangement" should be understood as an arrangement being beside the beam axis 50. According to other embodiments described herein, the detector 170 can be arranged in an on-axis arrangement. The term "on-axis arrangement" means, that the detector is located on the axis 50. Thus, different shapes and constructions of the detector may be used. Accordingly, the filter electrode may also have different shapes depending on whether an off-axis or an on-axis configuration is chosen.

According to some embodiments, the filter electrode 430 can be located between the sample 120 and the detector and does not have to be directly in front of the detector. Also, configurations placing the electrode above the sample surface, inside the objective lens or between objective lens and detector are in the scope of the invention.

FIG. 5b further shows a flood gun 460 to control and compensate the sample charge. According to embodiments described herein, the control unit 450 receives a signal from the detector containing information about the sample charge. The control unit 450 can calculate necessary countermeasures to keep the sample charge at a desired level and forward a signal to the flood gun 460. The flood gun 460 can operate in the amount necessary to compensate the sample charge.

According to embodiments described herein, a method of operating an ion beam device is provided. A voltage is supplied between an emitter and an electrode. Typically, the emitter includes an emitter base tip and an emitter supertip. A gas is supplied in the emitter region and the emitter emits ions of that operation gas. The resulting ion beam with a beam current is directed towards a sample in order to inspect or process the sample. According to embodiments described herein, the beam current is controlled by measuring the beam current with a beam current device.

According to some embodiments, the probe current measurement generates a signal that can be used to trigger a compensation measure. As a varying probe current is not desirable due to varying beam stability and therefore varying operation quality, it is desirable to keep the probe current at a certain level. This level may be predetermined or dependent on the operation.

To influence the probe current, several possibilities are provided. For instance, the emission current can be changed by changing the extraction voltage of the emitter. The probe current depends directly on the emission current. Further, an additional electrode can be provided acting as a suppressor to control the beam current. The suppressor can influence the field extraction strength and therefore the emission current. Another possibility arises from controlling the gas flow and/or the emitter temperature to affect the amount of gas condensation on the emitter. Furthermore, the probe current density can be changed by controlling the excitation of the condenser lens. According to some embodiments, these possibilities can be combined in any manner. According to other embodiments described herein, the possibilities can be used individually.

According to embodiments described herein, the probe current is controlled typically on a basis of 10 minutes or less, typically quasi continuously or continuously. According to further embodiments that can be combined with other embodiments described herein the probe current can be measured and controlled continuously. Therefore, compensation measures as described above can be initiated. Thereby, according to different options, compensation can start directly if the beam current changes. According to an alternative modification, the compensation may be started in the near future after the probe current changed, e.g. after the present specimen has been moved out of the ion beam system.

According to embodiments that can be combined with other embodiments described herein, the method of operating a focused ion beam device further includes measuring and controlling the sample charge. A voltage is supplied between an emitter and an electrode of the focused ion beam device and a gas is supplied to the region surrounding the emitter tip, the emitter tip region. Ions of the gas are emitted and the sample charge is measured and controlled.

According to embodiments described herein, the sample charge is measured during operation of the focused ion beam device. According to some embodiments, the sample charge is measured and controlled on a basis of 10 minutes or less, typically quasi continuously or continuously.

According to embodiments that can be combined with other embodiments described herein, the method further includes detecting a signal that is generated by the impingement of charged particles on the sample. A detector detects secondary particles that are caused by the impingement of the charged particle beam. These particles are emitted from the sample and travel to the detector. The signal of the detector can be used to trigger an event or to generate an image of the sample.

According to some embodiments described herein, a retarding field is implemented to measure the sample charge. Typically, the retarding field is located between the sample and the detector, whereby the detector can be arranged in a post-lens or a pre-lens configuration. According to embodiments that can be combined with other embodiments described herein, the detector may be in an on- or an off-axis arrangement. Typically, the retarding field configuration can be a detector and a filter electrode.

According to embodiments described herein, a control voltage can be supplied to the sample in order to compensate the sample charge generated by the charged particles. The control voltage may be provided by a conductive sample carrier, a flood gun or the like. The voltage is supplied for a certain time period. In this time, the sample charge measurement is continued and the values are compared with the desired threshold values. If the measured value of the sample charge is equal to or less than the threshold value, the control voltage is stopped.

According to embodiments described herein, the control voltage is supplied to the sample carrier continuously and the amount of the control voltage is changed according to the trigger signal that is based on the measured sample charge. Therefore, the sample charge is constant or at a defined level during operation of the focused ion beam device.

According to some embodiments, a focused ion beam device is provided including a gas field ion source with an emitter emitting an ion beam including ions of gas, an ion beam column and a sample charge control including a sample charge measurement unit.

According to some embodiments, which can be combined with other embodiments described herein, a focused ion beam device is provided, wherein the emitter may include an emitter base tip and an emitter supertip. According to some embodiments, the focused ion beam device with sample charge control may include a spectrometer for sample charge control. Alternatively, the focused ion beam device may include a retarding field configuration for sample charge control. Optionally, the focused ion beam device may contain a detector for measuring the sample charge. According to some embodiments, which can be combined with other embodiments described herein, the focused ion beam device may include a sample charge measurement unit and a detector for controlling the sample charge.

According to embodiments described herein, a method of operating an ion beam device having an ion beam column and a gas field ion source with an emitter tip in an emitter tip region is provided. The method includes applying a voltage between an emitter and an electrode, applying a gas to the emitter tip region, emitting ions of a gas from the emitter, and measuring and controlling a sample charge.

According to some embodiments, the method may include measuring and controlling the sample charge during operation of the ion beam device. Typically, the sample charge may be measured and controlled when changes to a threshold value have reached a predetermined limit, prior to the CD or DR imaging or before a certain number n of measurements has been conducted. According to embodiments which can be combined with other embodiments described herein, a signal may be detected that is generated by the impingement of the ion beam on a sample by a detector. Optionally, the measuring of the sample charge may include the implementation of a retarding field configuration between the sample and the detector. According to some embodiments, compensation measures can be triggered based on the measurement of the sample charge. Further, a control voltage may be supplied to the sample after measuring the sample charge. According to some embodiments, which can be combined with other embodiments described herein, a control voltage may be supplied to a sample carrier after measuring the sample charge. Optionally, the method of operating an ion beam device includes controlling the sample charge by a control loop.

While the foregoing is directed to embodiments of the invention, other and further embodiments of the invention may be devised without departing from the basic scope thereof, and the scope thereof is determined by the claims that follow.

The invention claimed is:

1. Focused ion beam system at least adapted for one of CD-measurements or DR-measurements of a specimen, comprising:
   a gas field ion source, the gas field ion source having an emitter tip;

the emitter tip having a base tip comprising a first material and a supertip comprising a material different from the first material, wherein the supertip is a single atom tip for emitting an ion beam;

wherein the base tip is a single crystal base tip;

a detector for detection of at least one of the group consisting of backscattered and secondary particles released from the specimen;

an analyzer for performing at least one of the group consisting of analyzing, evaluating, and classifying structures on the specimen and being connected to the detector; and a probe current control device comprising a current measurement device and having a control loop adapted to trigger a probe current control action.

2. The focused ion beam device according to claim 1, wherein the supertip is a coating of the base tip.

3. The focused ion beam device according claim 1, wherein the supertip is a metal supertip.

4. The focused ion beam device according to claim 1, wherein the base tip consists of a material selected from the group of: tungsten, tantalum, rhenium, molybdenum, and niobium.

5. The focused ion beam device according to claim 1, wherein the supertip consist of a material selected from the group of platinum, rhodium, and palladium.

6. The focused ion beam device according to claim 1, further comprising a deflector directing the ion beam to the measurement device.

7. The focused ion beam device according to claim 1, wherein the probe current measurement device comprises a Faraday cup.

8. The focused ion beam device according to claim 1, wherein the probe current measurement device comprises a beam limiting aperture.

9. The focused ion beam device according to claim 1, further comprising a sample charge control.

10. The focused ion beam device according to claim 9, wherein the sample charge control comprises a surface charge measurement device.

11. The focused ion beam device according to claim 9, wherein the sample charge control comprises a spectrometer.

12. The focused ion beam device according to claim 9, wherein the sample charge control comprises a retarding field configuration.

13. Method of operating a gas field ion source assembly having an emitter tip with a base tip comprising a first material and a supertip comprising a material different from the first material, wherein the base tip is a single crystal base tip; an electrode for providing an extraction voltage; a single emission center by the supertip; a probe current control device comprising a current measurement device and having a control loop, the method comprising:

emitting an ion beam comprising:
applying a voltage between the single emission center of the supertip and the electrode, and
supplying a gas to the emitter tip;
detecting a signal released from a specimen;
performing at least one of the group consisting of analyzing, evaluating and classifying the structure of the specimen with the detected signal, and triggering a probe current control action by the control loop.

14. The method according to claim 13, wherein the single emission center is provided by a single atom supertip.

15. The method according to claim 13, wherein the gas is helium, hydrogen, neon, argon or methane.

16. The method according to claim 13, wherein a probe current is controlled.

17. The method according to claim 16, further comprising controlling the probe current changes when the changes have reached a predetermined limit.

18. The method according to claim 16, wherein the controlling of the probe current comprises measuring the probe current.

19. The method according to claim 17, further comprising using the measurement of the probe current as a signal for changing the beam current.

20. The method according to claim 13, wherein a sample charge is controlled.

21. The method according to claim 20, wherein the sample charge is measured and controlled during operation of the ion beam device.

22. The method according to claim 21, further comprising triggering compensation measures based on the measurement of the sample charge.

23. The method according to any of claim 21, further comprising supplying a control voltage to the sample after measuring the sample charge.

\* \* \* \* \*